United States Patent [19]

Sawaya

[11] Patent Number: 5,124,783
[45] Date of Patent: Jun. 23, 1992

[54] SEMICONDUCTOR DEVICE HAVING INSULATING SUBSTRATE ADHERED TO CONDUCTIVE SUBSTRATE

[75] Inventor: Hiromichi Sawaya, Kanagawa, Japan

[73] Assignee: Kabushiki Kaisha Toshiba, Kawasaki, Japan

[21] Appl. No.: 460,630

[22] Filed: Jan. 3, 1990

[30] Foreign Application Priority Data

Jan. 30, 1989 [JP] Japan .................. 1-20213

[51] Int. Cl.[5] .................. H01L 23/02
[52] U.S. Cl. .................. 357/81; 357/80; 357/72; 357/70; 301/387; 301/388
[58] Field of Search .......... 357/80, 75, 74, 72, 357/81, 66, 70; 361/421, 403, 387, 388

[56] References Cited

U.S. PATENT DOCUMENTS

| | | | |
|---|---|---|---|
| 3,936,866 | 2/1976 | Grossman et al. | 357/80 |
| 4,200,880 | 4/1980 | Frey | 357/51 |
| 4,314,270 | 2/1982 | Iwatani | 357/75 |
| 4,459,166 | 7/1984 | Dietz et al. | 156/89 |
| 4,774,635 | 9/1988 | Greenberg et al. | 361/421 |
| 4,984,065 | 1/1991 | Sako | 357/81 |

FOREIGN PATENT DOCUMENTS

| | | |
|---|---|---|
| 0219627 | 4/1987 | European Pat. Off. . |
| 0231937 | 8/1987 | European Pat. Off. . |
| 6041249 | 3/1985 | Japan . |
| 0099247 | 4/1989 | Japan .................. 357/70 |
| 2144907 | 3/1985 | United Kingdom . |

Primary Examiner—Rolf Hille
Assistant Examiner—David Ostrowski
Attorney, Agent, or Firm—Oblon, Spivak, McClelland, Maier & Neustadt

[57] ABSTRACT

A semiconductor device includes at least one semiconductor chip, an insulating substrate having a predetermined wiring pattern thereon and a conductive island which supports the insulating substrate and the semiconductor chip. The periphery of the insulating substrate is adhered to the conductive island by an insulating adhesive. The semiconductor chip is positioned in a hole formed in the insulating substrate and is adhered to the conductive island by a conductive adhesive.

5 Claims, 3 Drawing Sheets

SEMICONDUCTOR DEVICE HAVING INSULATING SUBSTRATE ADHERED TO CONDUCTIVE SUBSTRATE

BACKGROUND OF THE INVENTION

1. Field of the Invention

This invention concerns a semiconductor device which includes an insulating substrate, having a predetermined wiring pattern thereon, adhered to a conductive substrate.

2. Description of the Prior Art

Conventionally, a semiconductor device including more than two semiconductor chips (called multichip semiconductor device) is utilized to meet the demand for a large scale integrated system.

FIG. 1 is a cross sectional view of a conventional multichip semiconductor device and FIG. 2 is a plan view thereof. FIG. 1 corresponds to the cross sectional view along the line I—I in FIG. 2. The device includes a conductive island portion 1, an insulating substrate 2 having a predetermined wiring pattern 3 thereon, two semiconductor chips 4, outer leads 5, bonding wires 6, adhesive 7 and 9 and mold resin 8. To electrically fix the semiconductor chips 4 to the wiring pattern 3 on the insulating substrate 2, a conductive adhesive, e.g., a paste containing silver (Ag) powder, is used as the adhesive 9. To simplify the production process, the conductive adhesive is also used as the adhesive 7 to fix the insulating substrate 2 to the conductive island portion 1.

Conventionally, the predetermined wiring pattern 3 on the insulating substrate 2 is composed of a copper leaf plated with gold (Au), for example. The Au plate is preferable to keep a good adhesion between the bonding wires 6 and the wiring pattern 3.

Usually, an elcectroplating method is used for the plating of the gold to insure a sufficient thickness of the Au plate layer. In the electroplating, a predetermined voltage supply is applied to the copper leaf. Thus, it is required that the copper leaf be continuously formed during the plating to assure sufficient gold plate thickness. Then, at the subsequent cutting process of the insulating substrate into the predetermined shape, the copper leaf plated with Au is simultaneously separated and a predetermined wiring pattern 3 is formed on the insulating substrate 2. Consequently, the wiring pattern 3 ends at the periphery of the insulating substrate 2 as shown in FIG. 2. If the amount of the conductive adhesive 7 and 9 is excessive, the adhesive may protrude outside and cause a short circuit between the conductive adhesive 7 and 9 and the wiring pattern 3. In addition, the conductive adhesive 7 may climb up the outside edges of the device and cause a short circuit with wiring layer 3.

Furthermore, the number of short circuits created is proportionally increased according to the number of semiconductor chips fixed on the substrate by the conductive adhesive, since the chance of contact between the conductive adhesive 9 under the semiconductor chip 4 and the adjacent wiring pattern 3 is increased. Thus, this makes it difficult to increase the number of the semiconductor chips mounted on each multichip device.

SUMMARY OF THE INVENTION

Therefore, an object of the present invention is to provide an improved semiconductor device which may be free from the short circuit between the adhesive and the conductive wiring pattern.

Another object of the present invention is to provide an improved semiconductor device which is especially preferable for a multichip semiconductor device.

To achieve the objects, this invention provides a semiconductor device which comprises at least one semiconductor chip, conductive supporting means for supporting the semiconductor chip thereon, an insulating substrate having a predetermined periphery and an inside portion, a predetermined wiring pattern formed on the insulating substrate and adhering means for adhering the insulating substrate and th· semiconductor chip to the conductive supporting me..ns, wherein the adhering means adheres the insulating substrate to the conductive supporting means in an isolated condition at least at the periphery of the insulating substrate.

BRIEF DESCRIPTION OF THE DRAWINGS

The acompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings.

DETAILED DESCRIPTION OF THE INVENTION

Figure 1:
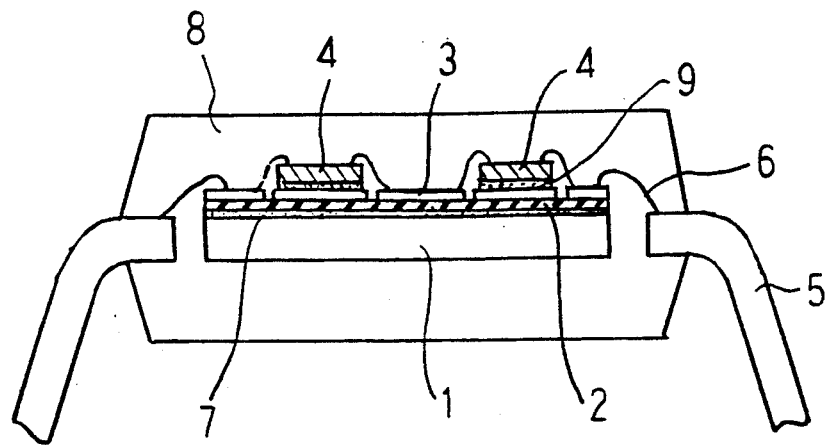
FIG. 1 is a cross sectional view of a conventional multichip semiconductor device.
Figure 2:
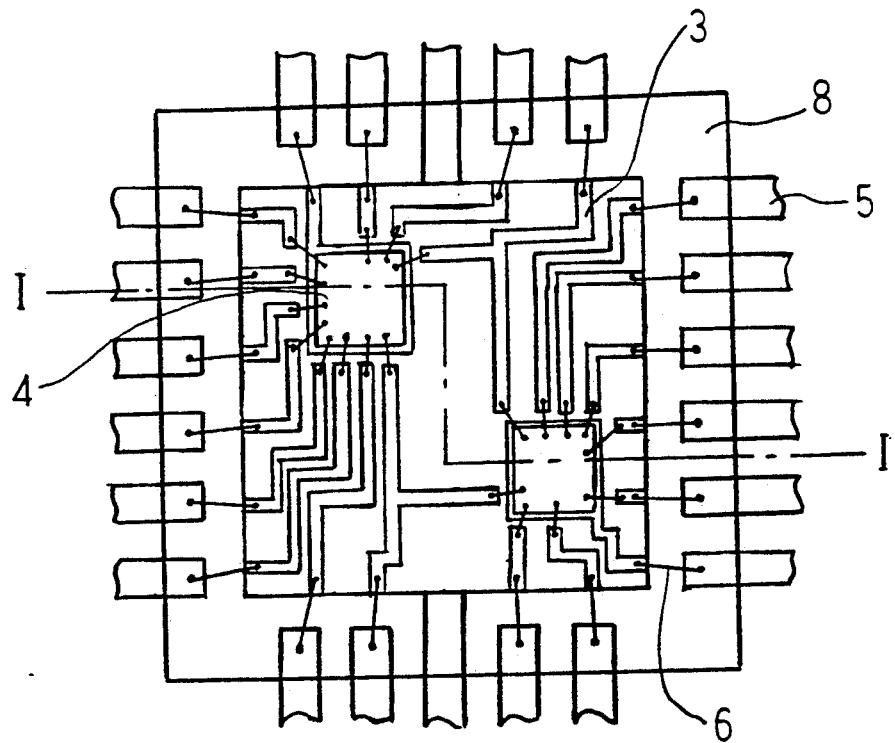
FIG. 2 is a plan view of the conventional multichip semiconductor device.
Figure 3:
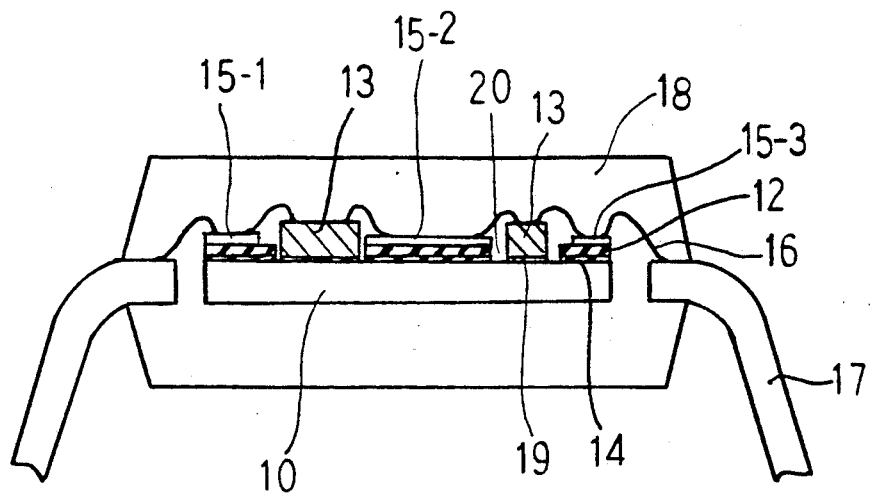
FIG. 3 is a cross sectional view of a preferred embodiment of the present invention.
Figure 4:
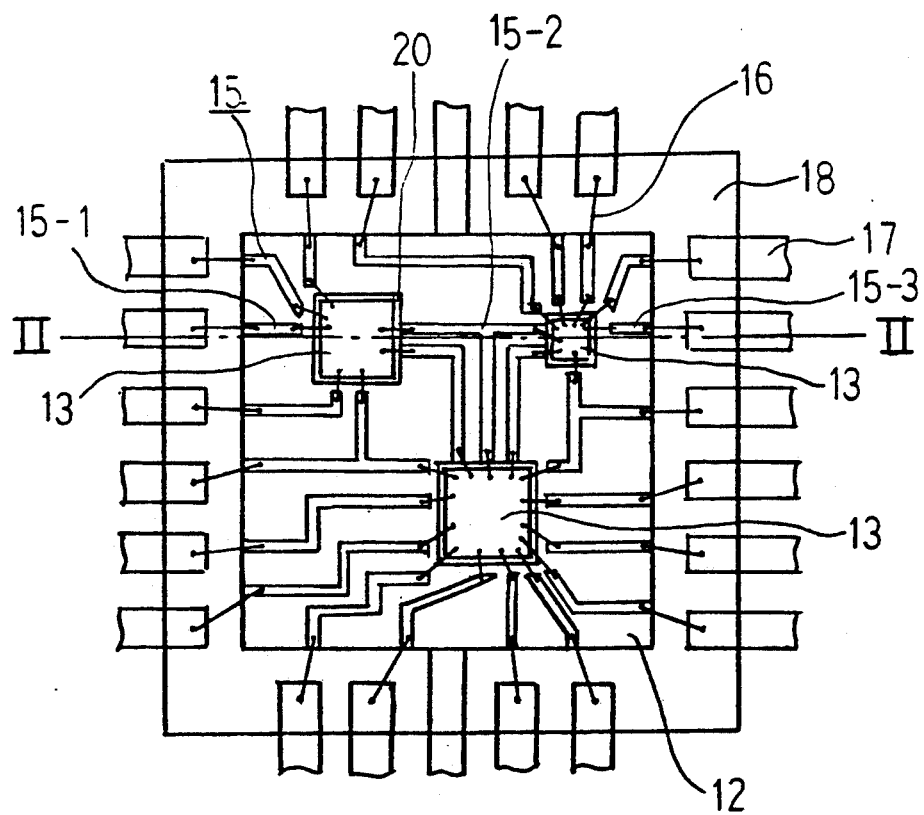
FIG. 4 is a plan view of the preferred embodiment of FIG. 3.

Referring now to FIGS. 3 and 4, a preferred embodiment of the present invention will be explained. FIG. 3 is a cross sectional view of a preferred embodiment of the present invention and FIG. 4 is a plan view thereof. FIG. 3 corresponds to the cross sectional view along the line II—II in FIG. 4.

The semiconductor device includes a conductive island 10, outer leads 17 and an insulating substrate 12. A predetermined wiring pattern 15 is formed on the insulating substrate 12. As shown in FIG. 3, the wiring pattern 15 includes a plurality of wiring branches, such as 15-1 and 15-2. The device also includes three semiconductor chips 13 and bonding wires 16 for electrically connecting the semiconductor chips 13 to the wiring pattern 15 or outer leads 17. The insulating substrate 12 has holes 20 each having a predetermined boundary and the semiconductor chips 13 are positioned in a corresponding hole 20. Since the conventional electroplating is used to form the wiring pattern 15, the wiring pattern is continuously formed on the insulating substrate 12 initially. Then, at a subsequent cutting process of the insulating substrate to the predetermined shape having the holes 20, the wiring pattern is simultaneously cut. Thus, at least one end of the each wiring branch coincides with the periphery of the insulating substrate 12 or the boundary of the holes 20. These elements are molded with a plastic resin 18.

In this construction, the insulating substrate 12 is adhered to the conductive island 10 by the insulating adhesive 14, e.g., epoxy adhesive. The epoxy adhesive 14 includes insulating materials, such as alumina and silica. On the other hand, the semiconductor chips 13 are adhered to the conductive island 10 by a conductive adhesive 19 made of epoxy resin including conductive materials, e.g., silver (Ag) powder.

In this construction, even if the adhesive 14 protrudes to contact with the wiring pattern 15 or the semiconductor chip 13, there is not short circuit problem since the adhesive 14 is an insulating adhesive. Furthermore, the semiconductor chips 13 are positioned in the holes 20. Thus, the distance between the conductive adhesive 19 and the wiring pattern 15 is increased due to the thickness of the insulating substrate 12, and the possibility of short circuits therebetween can be reduced.

Figure 5:
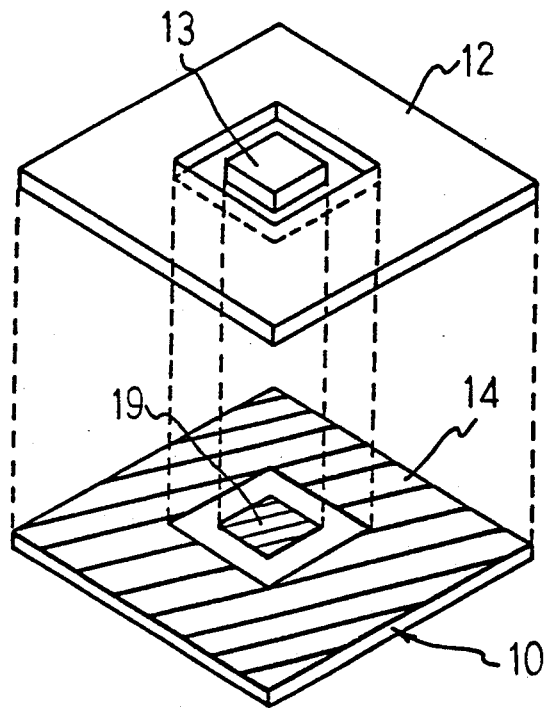
FIG. 5 is a perspective view illustrating the relationship between the insulating substrate and the adhesive on the island portion.

FIG. 5 is a perspective view illustrating the relationship between the insulating substrate 12, a semiconductor chip 13 and the conductive island 10. In this embodiment, the semiconductor chip 13 is adhered to the conductive island 10 by a conductive adhsive 19, and the whole surface of the insulating substrate 12 is fixed to the conductive island 10 by the insulating adhesive 14.

Figure 6:
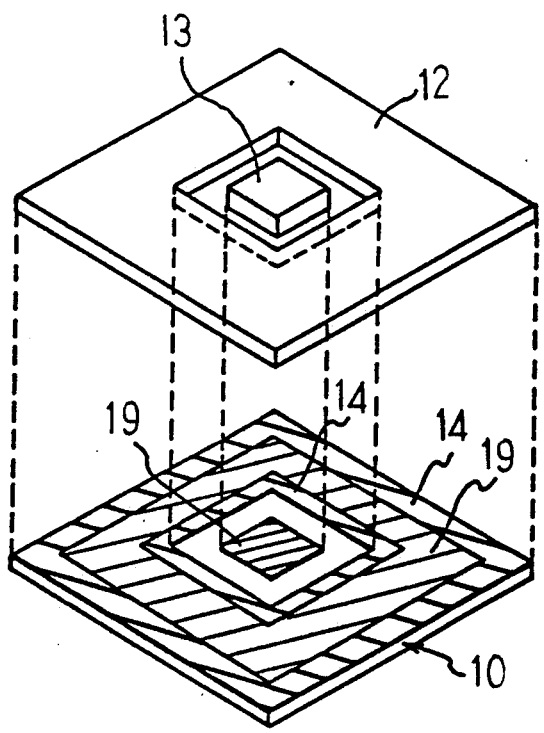
FIG. 6 is a perspective view illustrating a modified form of the pattern of the adhesive on the island portion.

FIG. 6 is a perspective view illustrating a modified form of the adhesive arrangement. In this embodiment, only the periphery of the insulating substrate 12 is fixed to the conductive island 10 by the insulating adhesive 14. Namely, the remaining portion or the central portion of the insulating substrate 12 is fixed to the conductive island 10 by the conductive adhesive 19. To form the adhesive 14 and 19, a dispenser method is used, for example. After the semiconductor chip 13 and the insulating substrate 12 are mounted on the adhesive, a thermal treatment is carried out to harden the adhesive.

Since the inside portion of the insulating substrate 12 is electrically connected to the conductive island 10, it is possible to electrically connect the wiring pattern (not shown) on the insulating substrate 12 to the conductive island 10 via a through hole (not shown) in the insulating substrate 12. Thus the degree of freedom in pattern layout can be increased. Of course, the short circuit problem due to the adhesive is prevented, since the periphery of the conductive adhesive 19 is surrounded by the insulating adhesive 14 formed along the periphery of the insulating substrate 12.

The present invention has been described with respect to specific embodiments. However, other embodiments based on the principles of the present invention should be obvious to those of ordinary skill in the art. Such embodiments are intended to be covered by the claims.

What is claimed is:

1. A semiconductor device which comprises at least one semiconductor chip, conductive supporting means for supporting the semiconductor chip thereon, an insulating substrate having a predetermined periphery and an inside portion, a predetermined wiring pattern formed on the insulating substrate, and adhering means for adhering the insulating substrate and the semiconductor chip to the conductive supporting means, characterized in that the adhering means adheres the insulating substrate to the conductive supporting means in an electrically isolated condition at least at the periphery of the insulating substrate, wherein the insulating substrate includes a hole having a predetermined boundary, the semiconductor chip is positioned in the hole and the adhering means adheres the semiconductor chip electrically to the conductive supporting means and wherein the adhering means also adheres the insulating substrate to the conductive supporting means in an electrically conductive manner at the inside portion of the insulating substrate.

2. The semiconductor device of claim 1, wherein the adhering means includes an insulating adhesive and a conductive adhesive, with the insulating adhesive surrounding the conductive adhesive along the periphery of the insulating substrate.

3. The semiconductor device of claim 1, wherein the predetermined wiring pattern includes a plurality of wiring branches each having at least two ends, with at least one end of each wiring branch being coincident with either the periphery of the insulating substrate or the boundary of the hole.

4. A semiconductor device comprising:
at least one semiconductor chip;
conductive support means;
an insulating substrate formed with at least one hole therein for receiving the at least one semiconductor chip therein;
insulating adhereing means for adhering the insulating substrate to the conductive support means;
conductive adhering means for adhering the at least one semiconductor chip to the conductive support means through the hole in said insulating substrate; and
a wiring pattern formed on said insulating substrate and being connected to said at least one semiconductor chip.

5. The semiconductor device of claim 4, wherein the inner and outer periphery of the insulating substrate is adhered to the conductive support means by said insulating adhering means and the remaining portion of the insulating substrate is adhered to the conductive support by said conductive adhering means.

* * * * *